(12) United States Patent
Chun et al.

(10) Patent No.: US 11,557,526 B2
(45) Date of Patent: Jan. 17, 2023

(54) SUBSTRATES FOR SEMICONDUCTOR DEVICE ASSEMBLIES AND SYSTEMS WITH IMPROVED THERMAL PERFORMANCE AND METHODS FOR MAKING THE SAME

(71) Applicant: Micron Technology, Inc., Boise, ID (US)

(72) Inventors: Hyunsuk Chun, Boise, ID (US); Xiaopeng Qu, Boise, ID (US); Chan H. Yoo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 105 days.

(21) Appl. No.: 17/061,435

(22) Filed: Oct. 1, 2020

(65) Prior Publication Data
US 2021/0407882 A1    Dec. 30, 2021

Related U.S. Application Data

(60) Provisional application No. 63/043,694, filed on Jun. 24, 2020.

(51) Int. Cl.
*H01L 23/373* (2006.01)
*H01L 23/367* (2006.01)
(Continued)

(52) U.S. Cl.
CPC .......... *H01L 23/373* (2013.01); *H01L 23/367* (2013.01); *H01L 23/498* (2013.01);
(Continued)

(58) Field of Classification Search
CPC .................................................. H01L 23/373
See application file for complete search history.

(56) References Cited

U.S. PATENT DOCUMENTS 7,315,078 B2 * 1/2008 Huang ................... H01L 24/85
257/E21.705
8,803,206 B1   8/2014 Or-Bach et al.
(Continued)

FOREIGN PATENT DOCUMENTS

EP      2914071 A1    9/2015
JP   2013239631 A   11/2013
(Continued)

OTHER PUBLICATIONS

International Search Report and Written Opinion dated Oct. 18, 2021 in International Application No. PCT/US2021/035620, 6 pages.
(Continued)

*Primary Examiner* — William A Harriston
(74) *Attorney, Agent, or Firm* — Perkins Coie LLP (57) ABSTRACT

Semiconductor device assemblies are provided with a package substrate including one or more layers of thermally conductive material configured to conduct heat generated by one or more of semiconductor dies of the assemblies laterally outward towards an outer edge of the assembly. The layer of thermally conductive material can comprise one or more allotropes of carbon, such as diamond, graphene, graphite, carbon nanotubes, or a combination thereof. The layer of thermally conductive material can be provided via deposition (e.g., sputtering, PVD, CVD, or ALD), via adhering a film comprising the layer of thermally conductive material to an outer surface of the package substrate, or via embedding a film comprising the layer of thermally conductive material to within the package substrate.

18 Claims, 8 Drawing Sheets

(51) Int. Cl.
*H01L 23/498* (2006.01)
*H01L 21/48* (2006.01)
*H01L 23/00* (2006.01)

(52) U.S. Cl.
CPC ............ *H01L 24/16* (2013.01); *H01L 21/481* (2013.01); *H01L 2224/16227* (2013.01)

(56) References Cited

U.S. PATENT DOCUMENTS

| | | | |
|---|---|---|---|
| 2009/0236733 A1* | 9/2009 | Chow | ............... H01L 23/49816 257/713 |
| 2011/0176280 A1 | 7/2011 | Lee | |
| 2011/0298110 A1 | 12/2011 | Pagaila et al. | |
| 2019/0122951 A1 | 4/2019 | Chen et al. | |
| 2019/0287874 A1 | 9/2019 | Campos | |
| 2020/0388552 A1 | 12/2020 | Chou et al. | |

FOREIGN PATENT DOCUMENTS

| | | |
|---|---|---|
| TW | I694566 B | 5/2020 |
| WO | 2012002294 A1 | 1/2012 |
| WO | 2016141217 A1 | 9/2016 |

OTHER PUBLICATIONS

Nan Wang et al., "Tailoring the Thermal and Mechanical Properties of Graphene Film by Structural Engineering", SMALL, vol. 14, No. 29, Jul. 1, 2018, pp. 1801346, XP055643023.

* cited by examiner

SUBSTRATES FOR SEMICONDUCTOR DEVICE ASSEMBLIES AND SYSTEMS WITH IMPROVED THERMAL PERFORMANCE AND METHODS FOR MAKING THE SAME

CROSS-REFERENCE TO RELATED APPLICATION

This application claims the benefit of U.S. Provisional Application No. 63/043,694, filed Jun. 24, 2020; which is incorporated herein by reference in its entirety.

TECHNICAL FIELD

The present disclosure generally relates to substrates for semiconductor devices, and more particularly relates to substrates for semiconductor device assemblies and systems with improved thermal performance and methods for making the same.

BACKGROUND

Packaged semiconductor dies, including memory chips, microprocessor chips, and imager chips, typically include one or more semiconductor dies mounted on a substrate and encased in a protective covering or capped with a heat-conducting lid. In operation, semiconductor dies can generate heat, which can pose a challenge for package design as the number of devices and the power density thereof increases. Various approaches to managing the generated heat include providing heat dissipating structures such as lids or heat sinks over the semiconductor dies to assist with heat exchange between the package and the environment in which it operates. Additional approaches to better manage heat generated by packaged semiconductor dies are desired.

DETAILED DESCRIPTION

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Figure 1:
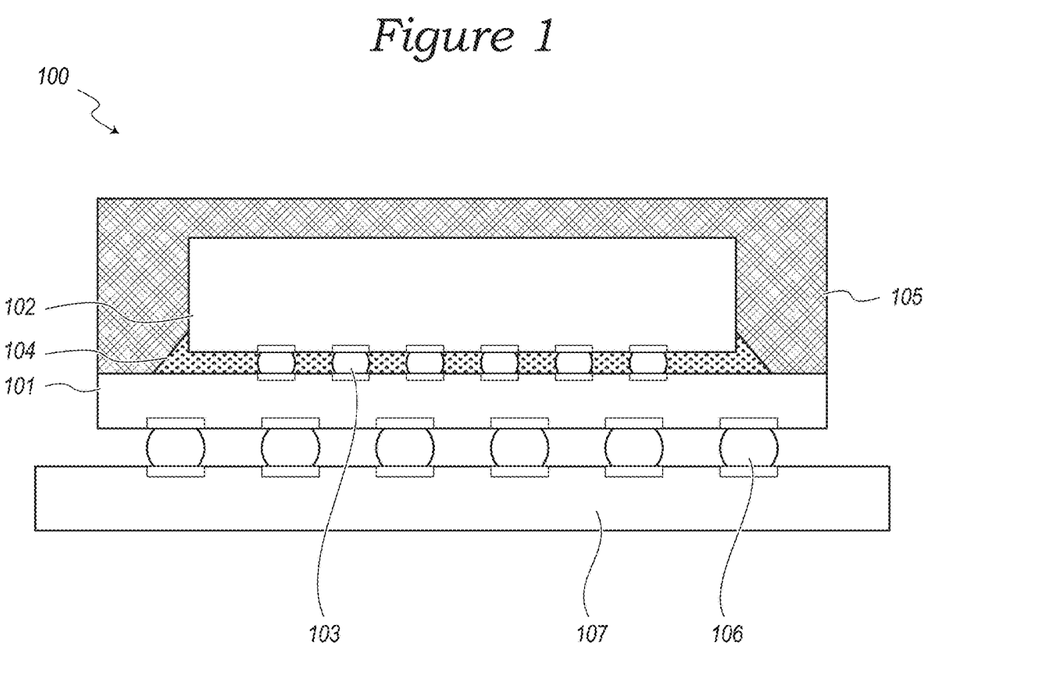
FIG. 1 is a simplified schematic cross-sectional view of a semiconductor device assembly.

FIG. 1 is a simplified schematic cross-sectional view of an exemplary semiconductor device assembly 100. The assembly 100 includes a package substrate 101 over which is disposed one or more semiconductor dies, such as semiconductor die 102. The semiconductor die 102 can be electrically connected to the package substrate 101 by a plurality of solder balls 103 and an underfill material 104. The semiconductor die 102 and package substrate 101 can be at least partially encapsulated by an encapsulant material 105 (e.g., mold resin or the like). When integrated into a larger system, the assembly 100 may be connected a plurality of package interconnects 106 (e.g., solder balls) to another device (e.g., system-level board) 107.

In the assembly 100 of FIG. 1, the semiconductor die 102 may generate significant heat during operation. Accordingly, to avoid unreliable operation that can result from excessive operating temperatures, the heat generated by the semiconductor die 102 can be conducted out of the assembly 100. Traditional approaches to conducting heat out of an assembly 100 can include a variety of heat-radiating structures attached to the assembly (e.g., a metal lid disposed over or around the assembly, with various fins or other surface-area increasing structures to encourage heat exchange between the lid and the environment). These heat-radiating structures, however, can contribute to the overall package height, which can be undesirable when the assembly 100 is used in a space-constrained environment (e.g., in a mobile device such as a cellular phone, computing tablet, laptop computer, etc.).

To address this limitation, in the embodiments described below, semiconductor device assemblies can include one or more layers of thermally conductive material disposed in or on a package substrate. The thermally conductive material can be configured to conduct heat generated by one or more semiconductor dies in an assembly laterally outward towards an outer edge of the substrate. By conducting the heat laterally outward toward an outer edge of the substrate, the heat generated in one location (e.g., a "hot spot" on the semiconductor die) can be dissipated over a wider area, and even further routed through one or more thermal vias to other structures connected to the assembly, improving the thermal performance and reliability of the assembly.

Figure 2A:
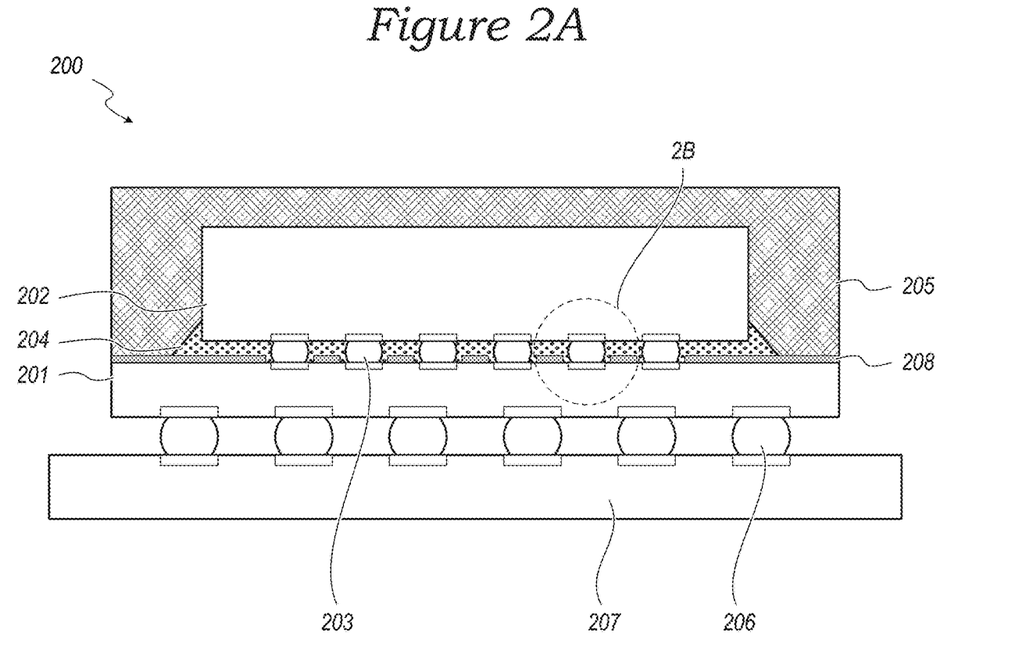
FIG. 2A is a simplified schematic cross-sectional view of a semiconductor device assembly in accordance with an embodiment of the present technology.
Figure 2B:
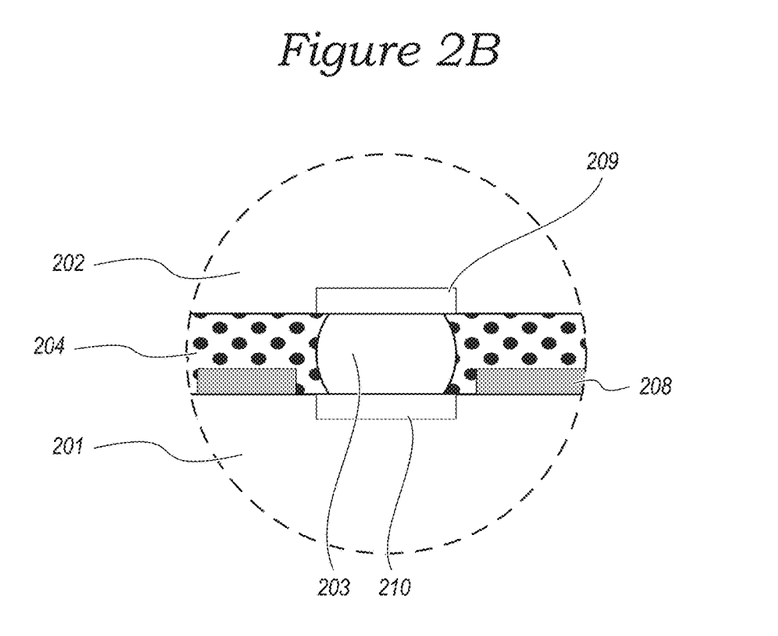
FIG. 2B is a zoomed simplified schematic partial cross-sectional view of the semiconductor device assembly of FIG. 2A in accordance with an embodiment of the present technology.

FIGS. 2A and 2B are simplified schematic cross-sectional views of a semiconductor device assembly in accordance with an embodiment of the present technology. As can be seen with reference to FIG. 2A, the assembly 200 includes a package substrate 201 over which is disposed one or more semiconductor dies, such as semiconductor die 202. The semiconductor die 202 can be electrically connected to the package substrate 201 by a plurality of solder balls 203 and an underfill material 204. The semiconductor die 202 and package substrate 201 can be at least partially encapsulated by an encapsulant material 205 (e.g., mold resin or the like). When integrated into a larger system, the assembly 200 may be connected a plurality of package interconnects 206 (e.g., solder balls) to another device (e.g., system-level board) 207.

To improve the thermal performance of the assembly 200, a layer of thermally conductive material 208 can be disposed over the package substrate 201. The thermally conductive material of the layer 208 can have a high thermal conductivity κ (e.g., more than 100 W/(m° K), more than 500 W/(m° K), more than 1,000 W/(m° K), or more than 1,500 W/(m° K)) in the x-y plane (e.g., perpendicular to the vertical stacking direction of the die 202 and the package substrate 201) to facilitate the conduction of heat (e.g., heat generated by one or more of the semiconductor dies) laterally outward (e.g., horizontally as depicted in FIG. 2) towards an edge of the substrate 201 and of the assembly 200. The layer of thermally conductive material 208 can comprise one or more of a number of materials with the requisite thermal conductivity, including various allotropes of carbon, such as diamond (κ>2000 W/(m° K)), graphite (κ=150-400 W/(m° K)), graphene (a single layer of which enjoys a high κ of 1500-2500 W/(m° K) in the x-y direction and a low κ of 7-10 W/(m° K) in the z direction), ordered or disordered carbon nanotubes (κ=200-3500 W/(m° K)), or the like. Alternatively, the layer of thermally conductive material 208 can comprise one or more of copper (κ=400 W/(m° K)), aluminum (κ=237 W/(m° K)), or the like. According to one aspect of the present disclosure, the thermal conductivity of the layer of thermally conductive material 208 may be substantially higher (by 30%, 50%, 100%, etc.) in the lateral direction (e.g., in the x-y plane) than in the vertical direction (e.g., in the z direction).

In accordance with one aspect of the present disclosure, the layer of thermally conductive material 208 can have a thickness of between about 0.1 μm and 10 μm. Accordingly, the contribution of the layer of thermally conductive material 208 to the overall package height of the semiconductor device assembly 200 can be minimal. In other embodiments, the thickness of the layer of thermally conductive material can be greater or lesser than this range, depending upon the desired overall package height, the properties of the thermally conductive material used, and the amount of heat that the layer is configured to conduct laterally toward an outer edge of the assembly 200. For example, in some embodiments in which graphene is used as the thermally conductive material, the layer of thermally conductive material 208 can have a thickness of less than 0.1 μm and still conduct significant thermal energy in the x-y direction (e.g., radially outward from between the semiconductor die 202 and the package substrate 201). In other embodiments in which a material with a lower thermal conductivity κ is used, the thickness of the layer of thermally conductive material 208 can be greater than 10 μm (e.g., between about 10 μm and 20 μm, or between about 20 μm and 50 μm). In accordance with one aspect of the present disclosure, the thickness of a layer of thermally conductive material may correspond to its in-plane thermal conductivity (e.g., thicker layers may be capable of greater heat conduction in an x-y plane than thinner layers).

According to another aspect of the present disclosure, the layer of thermally conductive material 208 can extend continuously from one edge to an opposite edge of the substrate. In other aspects, the layer of thermally conductive material 208 can extend continuously to all four outer edges of the substrate.

In one embodiment, the layer of thermally conductive material 208 can be provided over an upper surface of the package substrate 201 by any one of a number of deposition processes readily known to those skilled in the art, including sputtering, chemical vapor deposition (CVD), physical vapor deposition (PVD), atomic layer deposition (ALD), etc. In another embodiment, a layer of thermally conductive material can be provided in a pre-fabricated film (e.g., on a thin substrate of copper foil, silicon or silicon dioxide, on some other substrate or without any substrate at all) and applied to the surface of the package substrate 201.

Figure 3:
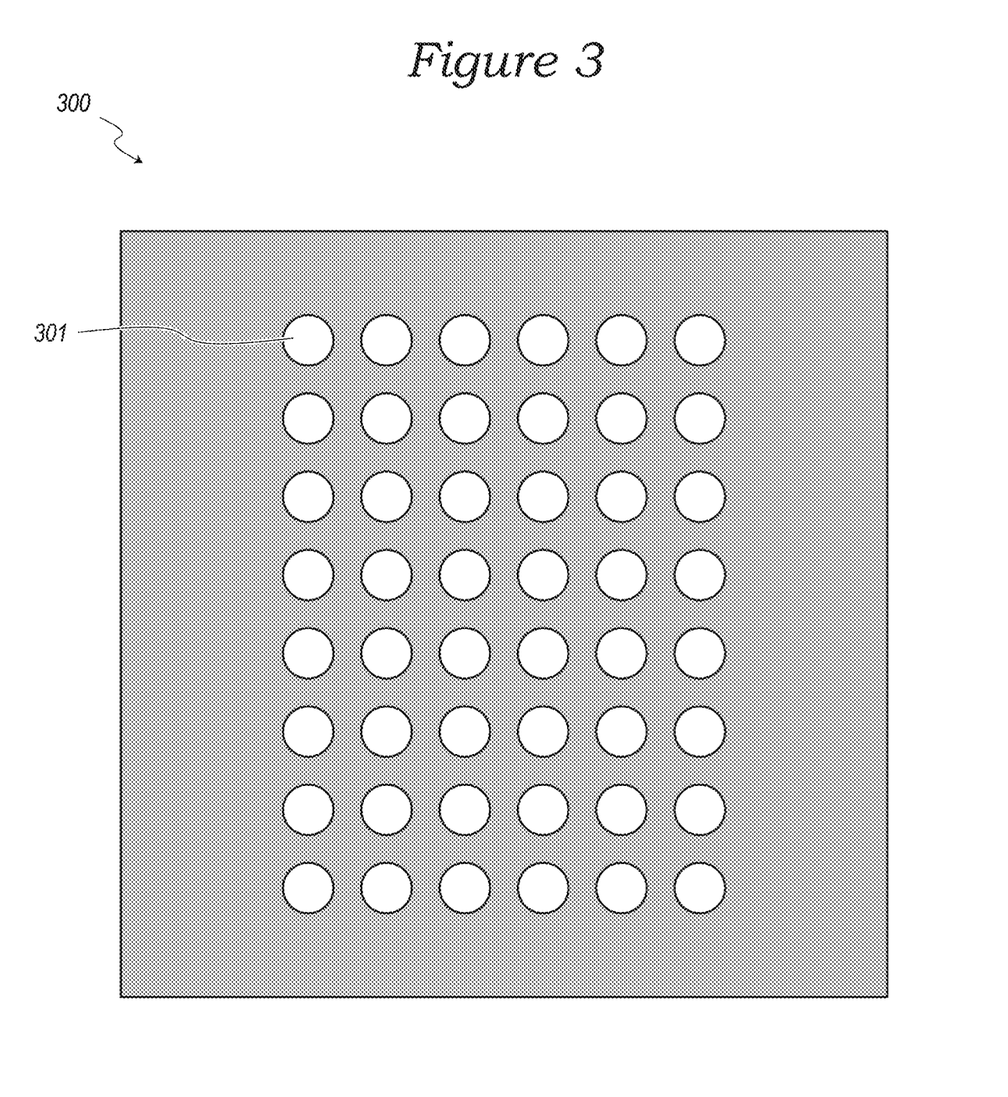
FIG. 3 is a simplified schematic overhead view of a layer of thermally conductive material in accordance with an embodiment of the present technology.

Because many thermally conductive materials are also electrically conductive, the layer of thermally conductive material 208 may be isolated from the electrical features connecting the semiconductor die 202 and the package substrate 201 (e.g., the solder balls 203, die pads 209 and substrate pads 210 illustrated in the detail view of FIG. 2B). One approach to providing this isolation is illustrated in FIG. 3, which provides a simplified schematic overhead view of a layer of thermally conductive material in accordance with an embodiment of the present technology. As can be seen with reference to FIG. 3, the layer of thermally conductive material 300 includes a plurality of openings 301 with a shape, position and size corresponding to the electrical features connecting a die to the package substrate over which it is to be disposed (e.g., the solder balls 203, die pads 209 and substrate pads 210 of FIG. 2B). The openings 301 can be formed with any one of a number of known semiconductor patterning and processing steps, such as photoresist masking and etching. For example, in an embodiment in which the layer of thermally conductive material 300 is deposited on a surface of the package substrate, the deposition can include a mask patterning step that provides isolation structures (e.g., cured photoresist) overlying each of the substrate pads 210 before the layer of thermally conductive material 300 is deposited, and a step after deposition of removing the isolation structures and the portions of thermally conductive material overlaying the same.

In an embodiment in which the layer of thermally conductive material 208 is provided in a film, the film (and optionally the substrate on which it is formed, if any) can be patterned similarly to the layer of thermally conductive material 300 illustrated in FIG. 3, either after application to the surface of the package substrate 201, or prior to application (e.g., by providing openings in an un-patterned film with a mechanical cutting step, a laser cutting step, or the like; or via formation of a patterned film using the foregoing masking and patterning steps on a film growth substrate).

According to one aspect of the present disclosure, the layer of thermally conductive material 208 can be formed as a monolithic structure (e.g., despite the presence of openings 301, the layer of thermally conductive material 208 comprises a single continuous structure, rather than a multitude of discrete parts). In accordance with other aspects of the present disclosure, the layer of thermally conductive material 208 can be formed from a plurality of discrete parts, either in thermal contact or separated.

Although in the foregoing example embodiments, layers of thermally conductive material have been illustrated and described with openings to provide isolation from electrical connection features, in other embodiments in which thermally conductive materials that are not electrically conductive are used, the foregoing patterning steps can be omitted, and a layer of thermally conductive material can be provided in direct contact with each of the electrical connection features (e.g., without the spacing between the substrate pad 210 and the layer of thermally conductive material 208 illustrated in FIGS. 2A and 2B) without risking shorting or inadvertent charge movement between interconnects.

Moreover, although in the foregoing example embodiments, layers of thermally conductive material have been illustrated and described as having plan dimensions corresponding to a package substrate (e.g., having external outlines of the same size), in other embodiments layers of thermally conductive material can have smaller plan dimensions than the package substrates on or in which they are disposed (e.g., not extending all the way to an outer edge of the substrate).

Although in the foregoing example embodiments semiconductor device assemblies have been illustrated and described in which a single layer of thermally conductive material has been provided over an upper surface of a package substrate, in other embodiments semiconductor device assemblies can include layers of thermally conductive material in different arrangements (e.g., one or more layers on an upper surface of a package substrate, one or more layers on a lower surface of a package substrate, or any combination thereof) to increase the thermal performance of the assemblies. In embodiments in which a layer of thermally conductive material is provided on the lower surface of a package substrate, the layer could be provided using a film attach or deposition process, optionally in combination with any one of a number of known semiconductor patterning and processing steps (e.g., photoresist masking, etching, etc.), analogously to the fabrication steps discussed in greater detail above. Moreover, in accordance with yet another aspect of the present disclosure, one or more layers of thermally conductive material can be embedded within a substrate, either in lieu of or in addition to layers on the surface(s) of the substrate, as set forth in greater detail below.

Figure 4:
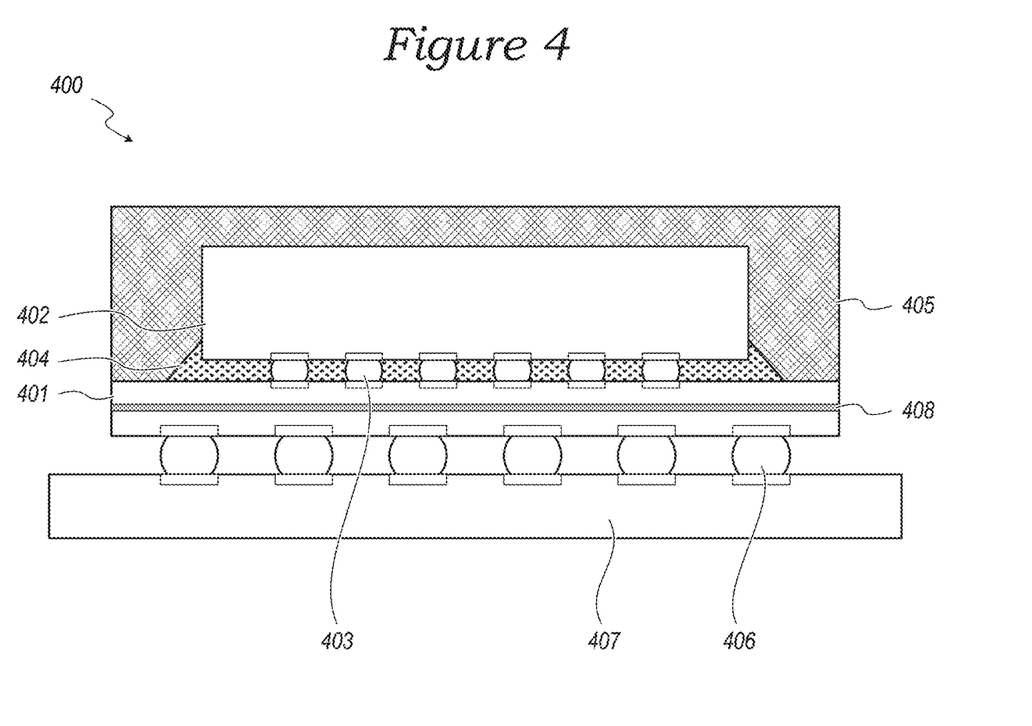
FIG. 4 is a simplified schematic cross-sectional view of a semiconductor device assembly in accordance with an embodiment of the present technology.

For example, FIG. 4 is a simplified schematic cross-sectional view of a semiconductor device assembly in accordance with an embodiment of the present technology. As can be seen with reference to FIG. 4, the assembly 400 includes a package substrate 401 over which is disposed one or more semiconductor dies, such as semiconductor die 402. The semiconductor die 402 can be electrically connected to the package substrate 401 by a plurality of solder balls 403 and an underfill material 404. The semiconductor die 402 and package substrate 401 can be at least partially encapsulated by an encapsulant material 405 (e.g., mold resin or the like). When integrated into a larger system, the assembly 400 may be connected a plurality of package interconnects 406 (e.g., solder balls) to another device (e.g., system-level board) 407.

To improve the thermal performance of the assembly 400, a layer of thermally conductive material 408 is embedded within (e.g., between the outermost upper and lower surfaces of) the package substrate 401. The thermally conductive material of the layer 408 can have a high thermal conductivity κ to facilitate the conduction of heat laterally outward (e.g., horizontally as depicted in FIG. 4) towards an edge of the substrate 401 and of the assembly 400. The layer of thermally conductive material 408 can be formed during a layer-by-layer fabrication of the package substrate 401. In this regard, the package substrate fabrication may involve iteratively providing clad core layers and dielectric layers, together with circuit routing elements (e.g., traces and vias). Following the formation of a dielectric layer, a layer of thermally conductive material 408 (e.g., a film of graphene having a thickness of 5-15 μm) can be provided over the dielectric layer and patterned (e.g., via laser etching) to provide electrical isolation between the layer of thermally conductive material 408 and the circuit routing elements. In some embodiments, multiple such layers of thermally conductive material could be provided, either over different dielectric layers (e.g., at different vertical positions in the package substrate 401), in contiguous stacks (e.g., in direct contact with one another), or some combination thereof.

Figure 5:
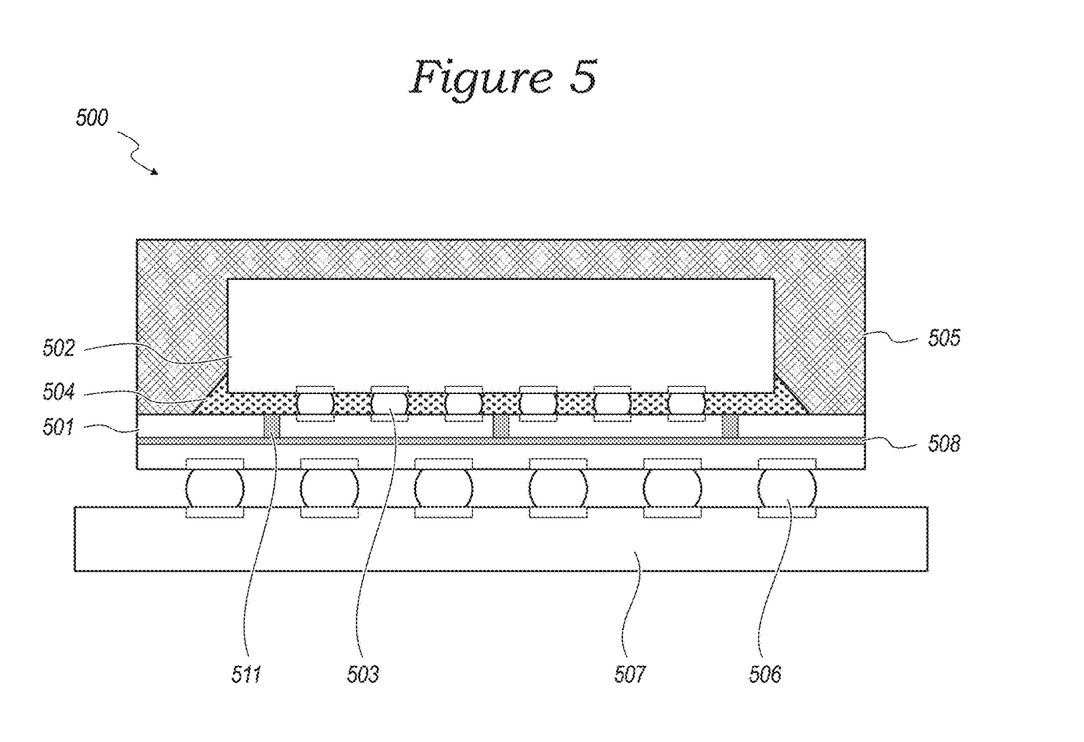
FIG. 5 is a simplified schematic cross-sectional view of a semiconductor device assembly in accordance with an embodiment of the present technology.

In embodiments in which a layer of thermally conductive material is embedded within a package substrate of an assembly, it may be helpful to provide heat-routing elements to facilitate the conduction of heat from one or more dies in the assembly to the embedded layer of thermally conductive material. For example, FIG. 5 is a simplified schematic cross-sectional view of one such semiconductor device assembly in accordance with an embodiment of the present technology. As can be seen with reference to FIG. 5, the assembly 500 includes a package substrate 501 over which is disposed one or more semiconductor dies, such as semiconductor die 502. The semiconductor die 502 can be electrically connected to the package substrate 501 by a plurality of solder balls 503 and an underfill material 504. The semiconductor die 502 and package substrate 501 can be at least partially encapsulated by an encapsulant material 505 (e.g., mold resin or the like). When integrated into a larger system, the assembly 500 may be connected a plurality of package interconnects 506 (e.g., solder balls) to another device (e.g., system-level board) 507.

To improve the thermal performance of the assembly 500, a layer of thermally conductive material 508 is embedded within the package substrate 501. The thermally conductive material of the layer 508 can have a high thermal conductivity κ to facilitate the conduction of heat laterally outward (e.g., horizontally as depicted in FIG. 5) towards an edge of the substrate 501 and of the assembly 500. To facilitate the conduction of heat from the semiconductor die 502 to the layer of thermally conductive material 508, thermal vias 511 are provided between an upper surface of the package substrate 501 and the layer of thermally conductive material 508. The thermal vias 511 can comprise a material with high thermal conductivity κ to facilitate the conduction of heat vertically downward into the layer of thermally conductive material 508. According to one aspect of the present disclosure, the thermal vias 511 can comprise copper, aluminum, or another metal readily compatible with substrate fabrication processes (e.g., analogous to the vias formed as circuit routing elements). Alternatively, the thermal vias 511 can comprise an allotrope of carbon configured with a high thermal conductivity in the z-direction. The thermal vias 511 can be configured in both size and number to balance the competing benefits of additional thermal conduction in a vertical direction (e.g., by providing larger and/or more thermal vias 511) with substrate size and expense (e.g., associated with spaced used for circuit routing elements).

Although the foregoing example embodiments have been illustrated and described with a single layer of thermally conductive material on or in a substrate, in other embodiments a substrate could be provided with multiple layers of thermally conductive material to increase the laterally-outward conduction of heat generated in an assembly. For example, in one embodiment, a package substrate could be provide with a first layer of thermally conductive material on an upper surface thereof (e.g., between the package substrate and the die(s) disposed thereon), and another layer of thermally conductive material embedded therein or on a lower surface thereof (e.g., between the package substrate and a larger system board to which the assembly is attached). The layers could each comprise the same material, or could include different materials (e.g., depending upon the various design constraints of total package height, bond line thickness, processing temperature limitations, etc.). In another embodiment, a die could include multiple stacked layers of thermally conductive material on a single side (e.g., on either the upper surface, the lower surface, embedded inside, or any combination thereof). The stack of thermally conductive layers could include multiple layers of the same material, or could be heterogenous stacks including multiple layers of different thermally conductive materials.

Moreover, although in the foregoing example embodiments semiconductor device assemblies have been illustrated and described in which heat generated by one or more semiconductor devices is conducted laterally outwards, in other embodiments semiconductor device assemblies and systems including the same can comprise thermal vias and layers of thermally conductive material in different arrangements to increase the thermal performance of these assemblies and systems. For example, thermal vias can be provided in a semiconductor device assembly to conduct heat downwardly out of the assembly to a system-level board, which can itself include thermal vias and layers of thermally conductive material that form an extended thermal circuit. One such system is illustrated in the simplified schematic cross-sectional view of FIG. 6, in accordance with an embodiment of the present technology.

Figure 6:
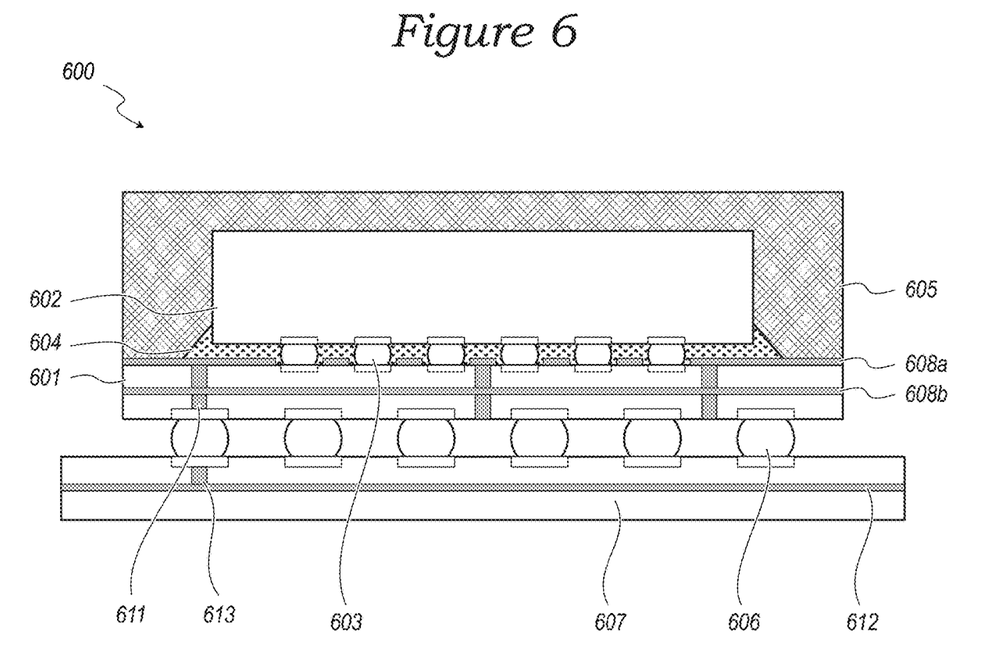
FIG. 6 is a simplified schematic cross-sectional view of a semiconductor device assembly in accordance with an embodiment of the present technology.

As can be seen with reference to FIG. 6, a semiconductor device assembly 600 can include a package substrate 601 over which is disposed one or more semiconductor dies, such as semiconductor die 602. The semiconductor die 602 can be electrically connected to the package substrate 601 by a plurality of solder balls 603 and an underfill material 604. The semiconductor die 602 and package substrate 601 can be at least partially encapsulated by an encapsulant material 605 (e.g., mold resin or the like). When integrated into a larger system, the assembly 600 may be connected a plurality of package interconnects 606 (e.g., solder balls) to another device (e.g., system-level board) 607.

To improve the thermal performance of the assembly 600, a first layer of thermally conductive material 608a is disposed over an upper surface of the package substrate 601, and a second layer of thermally conductive material 608b is embedded within the package substrate 601. The thermally conductive material of these layers 608a and 608b can have a high thermal conductivity κ to facilitate the conduction of heat laterally outward (e.g., horizontally as depicted in FIG. 6) towards an edge of the substrate 601 and of the assembly 600. To facilitate the conduction of heat from the semiconductor die 602 and the first layer of thermally conductive material 608a to the second layer of thermally conductive material 608b and out of the assembly 600, thermal vias 611 are provided between the upper surface of the package substrate 601 and the bottom surface of the package substrate 601, passing through and/or contacting the second layer of thermally conductive material 608b. The thermal vias 611 can comprise a material with high thermal conductivity κ to facilitate the conduction of heat vertically downward through the package substrate 601. According to one aspect of the present disclosure, the thermal vias 611 can comprise copper, aluminum, or another metal readily compatible with substrate fabrication processes (e.g., analogous to the vias formed as circuit routing elements). Alternatively, the thermal vias 611 can comprise an allotrope of carbon configured with a high thermal conductivity in the z-direction. The thermal vias 611 can be configured in both size and number to balance the competing benefits of additional thermal conduction in a vertical direction (e.g., by providing larger and/or more thermal vias 611) with substrate size and expense (e.g., associated with spaced used for circuit routing elements).

To further improve the thermal performance of the assembly 600 and the system into which it is integrated, thermal vias 611 may also be connected to one or more of the package interconnects 606 (e.g., solder balls) to conduct heat out of the assembly and into system-level board 607. To further facilitate the movement of heat within and/or out of the larger system, the system-level board 607 may similarly include a layer of thermally conductive material 612, either disposed thereon (e.g., on an upper or lower surface thereof) or embedded therein, as in the embodiment illustrated in FIG. 6. The system-level board may also similarly include one or more thermal vias 613 to conduct heat from one or more of the solder balls 606 (e.g., the solder balls to which the thermal vias 611 of the assembly 600 are connected) to the embedded layer of thermally conductive material 613. In an alternate embodiment in which the system-level board 607 includes a layer of thermally conductive material disposed over a top surface thereof, the thermal vias 613 may be omitted. According to one aspect of the present disclosure, the thermal circuit thus formed between the layers of thermally conductive material and the thermal vias in the assembly and/or the system-level board to which the assembly is connected can provide greatly improved conduction of the heat generated by a semiconductor die of the assembly far from the assembly (e.g., to remote heat dissipation structures such as heat sinks or the like).

According to one aspect of the present disclosure, the thermal circuit illustrated in FIG. 6 may be electrically isolated from the semiconductor device 602 of the assembly 600 (e.g., by utilizing solder balls 603 not purposed for electrical communication or power delivery). Alternatively, a thermal circuit comprising multiple layers of thermally conductive material that are connected by thermal vias and one or more interconnects may share an interconnect with an electrical circuit of the semiconductor device, such as a grounding pin.

Figure 7:
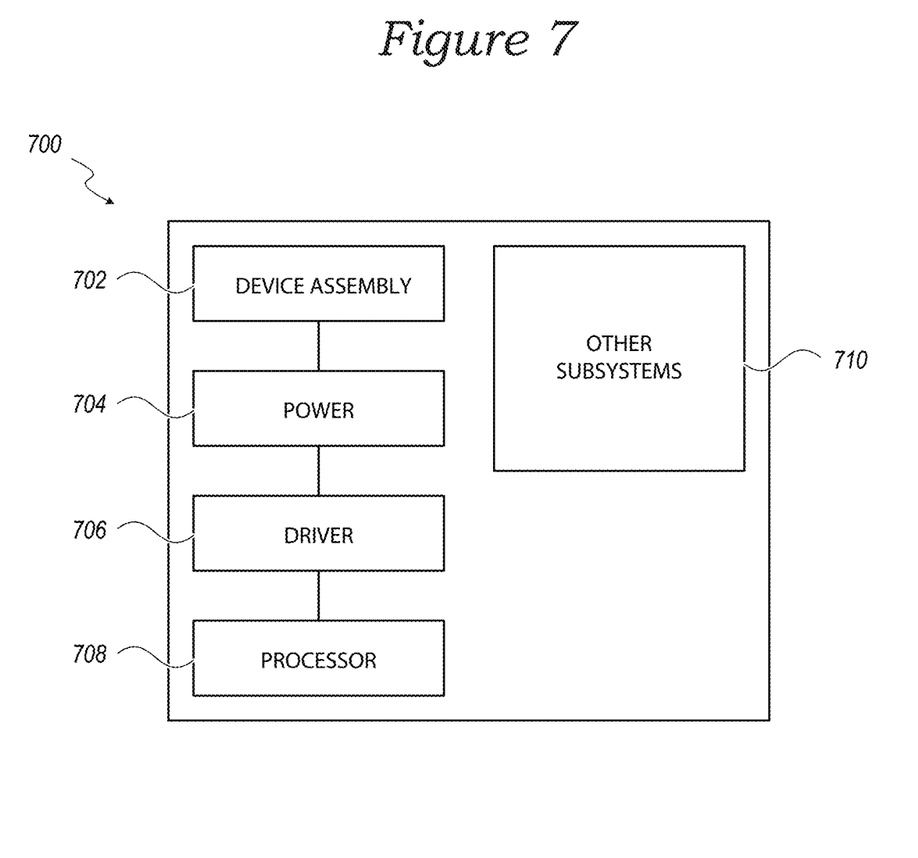
FIG. 7 is a schematic view showing a system that includes a semiconductor device assembly configured in accordance with an embodiment of the present technology.

Any one of the semiconductor devices and semiconductor device assemblies described above with reference to FIGS. 2-6 can be incorporated into any of a myriad of larger and/or more complex systems, a representative example of which is system 700 shown schematically in FIG. 7. The system 700 can include a semiconductor device assembly (e.g., or a discrete semiconductor device) 702, a power source 704, a driver 706, a processor 708, and/or other subsystems or components 710. The semiconductor device assembly 702 can include features generally similar to those of the semiconductor devices described above with reference to FIGS. 2-6. The resulting system 700 can perform any of a wide variety of functions, such as memory storage, data processing, and/or other suitable functions. Accordingly, representative systems 700 can include, without limitation, handheld devices (e.g., mobile phones, tablets, digital readers, and digital audio players), computers, vehicles, appliances and other products. Components of the system 700 may be housed in a single unit or distributed over multiple, interconnected units (e.g., through a communications network). The components of the system 700 can also include remote devices and any of a wide variety of computer readable media.

Figure 8:
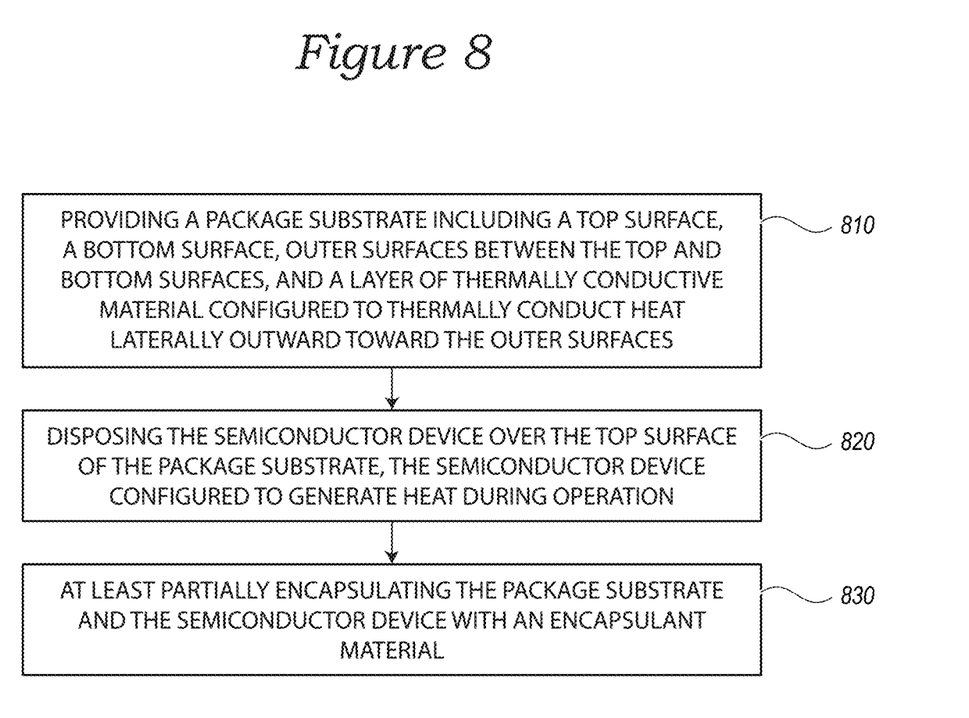
FIG. 8 is a flow chart illustrating a method of making a semiconductor device assembly in accordance with an embodiment of the present technology.

FIG. 8 is a flow chart illustrating a method of making a semiconductor device assembly. The method includes providing a package substrate including a top surface, a bottom surface, outer surfaces between the top and bottom surfaces, and a layer of thermally conductive material configured to thermally conduct heat laterally outward toward the outer surfaces (box 810). The method further includes disposing the semiconductor device over the top surface of the package substrate, the semiconductor device configured to generate heat during operation (box 820) and at least partially encapsulating the package substrate and the semiconductor device with an encapsulant material (box 830).

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
    a package substrate including a top surface, a bottom surface, and outer surfaces between the top and bottom surfaces;
    a semiconductor device disposed over the top surface of the package substrate, the semiconductor device configured to generate heat during operation; and
    an encapsulant material at least partially encapsulating the package substrate and the semiconductor device,
    wherein the package substrate includes a layer of thermally conductive material configured to thermally conduct the heat generated by the semiconductor device laterally outward toward the outer surfaces, and
    wherein the layer of thermally conductive material is embedded between the top surface and the bottom surface of the package substrate.

2. The semiconductor device assembly of claim 1, wherein the layer of thermally conductive material is directly in contact with either the top surface or the bottom surface of the package substrate.

3. The semiconductor device assembly of claim 1, wherein the layer of thermally conductive material is isolated from conductive interconnects disposed between and electrically connecting the semiconductor device and the package substrate.

4. The semiconductor device assembly of claim 1, wherein the layer of thermally conductive material extends continuously from one edge of the package substrate to an opposing edge of the package substrate.

5. The semiconductor device assembly of claim 1, wherein the layer of thermally conductive material comprises graphene, graphite, carbon nanotubes, or a combination thereof.

6. The semiconductor device assembly of claim 1, wherein the layer of thermally conductive material has a thermal conductivity κ of greater than 500 W/(m° K).

7. The semiconductor device assembly of claim 1, wherein the layer of thermally conductive material has a thickness of between 0.1 μm and 10 μm.

8. The semiconductor device assembly of claim 1, wherein the package substrate further comprises one or more thermal vias extending from the layer of thermally conductive material to the top surface, the bottom surface, or both.

9. A method of making a semiconductor device assembly, comprising:
    providing a package substrate including a top surface, a bottom surface, and outer surfaces between the top and bottom surfaces;
    disposing a semiconductor device over the top surface of the package substrate, the semiconductor device configured to generate heat during operation; and
    at least partially encapsulating the package substrate and the semiconductor device with an encapsulant material,
    wherein the package substrate includes a layer of thermally conductive material configured to thermally conduct the heat generated by the semiconductor device laterally outward toward the outer surfaces, and wherein providing the package substrate includes embedding a film comprising the layer of thermally conductive material between the top surface and the bottom surface of the package substrate.

10. The method of claim 9, wherein providing the package substrate includes depositing the layer of thermally conductive material comprises over the top surface or the bottom surface of the package substrate by sputtering, physical vapor deposition (PVD), chemical vapor deposition (CVD), or atomic layer deposition (ALD).

11. The method of claim 9, wherein providing the package substrate includes adhering a film comprising the layer of thermally conductive material over the top surface or the bottom surface of the package substrate.

12. The method of claim 9, wherein the layer of thermally conductive material comprises graphene, graphite, carbon nanotubes, or a combination thereof.

13. The method of claim 9, wherein the layer of thermally conductive material has a thermal conductivity κ of greater than 500 W/(m° K).

14. The method of claim 9, wherein the layer of thermally conductive material has a thickness of between 0.1 μm and 10 μm.

15. A semiconductor device assembly, comprising:
a package substrate including a top surface, a bottom surface, and outer surfaces between the top and bottom surfaces;
a semiconductor device disposed over the top surface of the package substrate, the semiconductor device configured to generate heat during operation; and
an encapsulant material at least partially encapsulating the package substrate and the semiconductor device,
wherein the package substrate includes:
a first layer of thermally conductive material disposed over the top surface and configured to thermally conduct the heat generated by the semiconductor device laterally outward toward the outer surfaces,
a second layer of thermally conductive material closer to the bottom surface of the package substrate than the first layer of thermally conductive material, the second layer of thermally conductive material configured to thermally conduct the heat generated by the semiconductor device laterally outward toward the outer surfaces, and
a plurality of thermal vias extending between the first and second layers of thermally conductive material.

16. The semiconductor device assembly of claim 15, wherein the second layer of thermally conductive material is disposed over the bottom surface of the package substrate.

17. The semiconductor device assembly of claim 15, wherein the second layer of thermally conductive material is embedded between the top surface and the bottom surface of the package substrate.

18. The semiconductor device assembly of claim 15, wherein the first and second layers of thermally conductive material each comprises graphene, graphite, carbon nanotubes, or a combination thereof.

\* \* \* \* \*